(12) United States Patent
Nakayama et al.

(10) Patent No.: US 9,226,417 B2
(45) Date of Patent: Dec. 29, 2015

(54) LOCK MECHANISM OF ELECTRIC CONNECTION BOX

(75) Inventors: Makoto Nakayama, Shizuoka-ken (JP); Masahiro Kanamaru, Shizuoka-ken (JP)

(73) Assignee: Yazaki Corporation, Tokyo (JP)

(*) Notice: Subject to any disclaimer, the term of this patent is extended or adjusted under 35 U.S.C. 154(b) by 1304 days.

(21) Appl. No.: 12/105,747

(22) Filed: Apr. 18, 2008

(65) Prior Publication Data

US 2008/0256996 A1 Oct. 23, 2008

(30) Foreign Application Priority Data

Apr. 19, 2007 (JP) .................. P2007-110638

(51) Int. Cl.
*B65D 6/28* (2006.01)
*H05K 5/02* (2006.01)
*H05K 7/02* (2006.01)

(52) U.S. Cl.
CPC .............. H05K 5/0221 (2013.01); H05K 7/026 (2013.01); *Y10T 70/554* (2015.04)

(58) Field of Classification Search
CPC ............................. H05K 5/0221; H05K 7/026
USPC ........ 292/80, 87, 84; 312/111, 140; 24/593.1, 24/596.1
See application file for complete search history.

(56) References Cited

U.S. PATENT DOCUMENTS

| | | | | |
|---|---|---|---|---|
| 4,501,378 A | * | 2/1985 | Berfield | 220/324 |
| 5,577,779 A | * | 11/1996 | Dangel | 292/80 |
| 5,944,210 A | * | 8/1999 | Yetter | 220/4.21 |
| 6,082,786 A | * | 7/2000 | Stephens et al. | 292/102 |
| 6,196,882 B1 | * | 3/2001 | Sato et al. | 439/701 |
| 8,665,603 B2 | * | 3/2014 | Brieda et al. | 361/759 |
| 2003/0109150 A1 | * | 6/2003 | Saka et al. | 439/76.2 |
| 2010/0308055 A1 | * | 12/2010 | Sams | 220/324 |

FOREIGN PATENT DOCUMENTS

| | | |
|---|---|---|
| JP | 61-189717 | 11/1986 |
| JP | 6-24322 | 3/1994 |
| JP | 09-028018 | 1/1997 |
| JP | 2004-312844 | 11/2004 |
| JP | 2005-86865 | 3/2005 |

OTHER PUBLICATIONS

Notification of Reasons for Refusal dated Dec. 6, 2012, for counterpart Japanese Patent Application No. 2007-110638 (2 pages).

* cited by examiner

*Primary Examiner* — Kristina Fulton
*Assistant Examiner* — Thomas Neubauer
(74) *Attorney, Agent, or Firm* — Sughrue Mion, PLLC

(57) ABSTRACT

A lock mechanism includes: a lock arm provided in a cantilever manner on an inner wall of a part compartment of a box body of an electric connection box; and a lock projection provided to the lock arm on its surface facing a part housed in the part compartment. The lock arm can be divided in a longitudinal direction into: a base end region fixed to the inner wall; upper end region located in the free end which interferes with the part and receives a pressing force for unlocking operation; and a middle region located within a predetermined distance range between the base and upper end region. The flexural rigidity of the base and upper end region is set larger than that of the middle region by providing ribs on the base and upper end region and providing no ribs on the middle region.

16 Claims, 19 Drawing Sheets

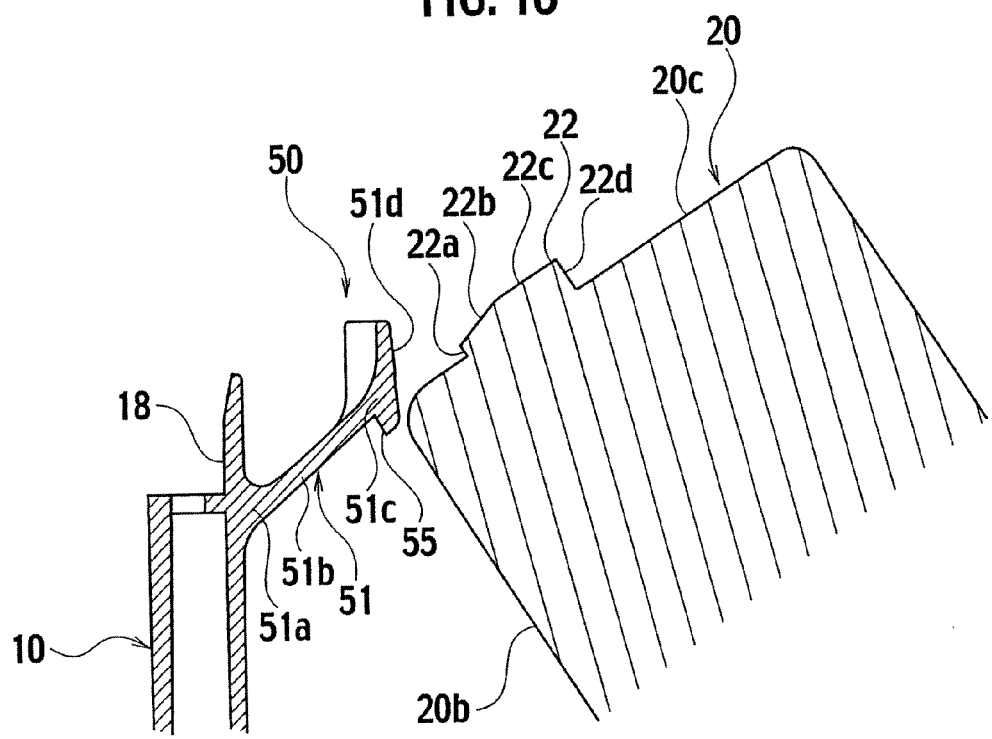
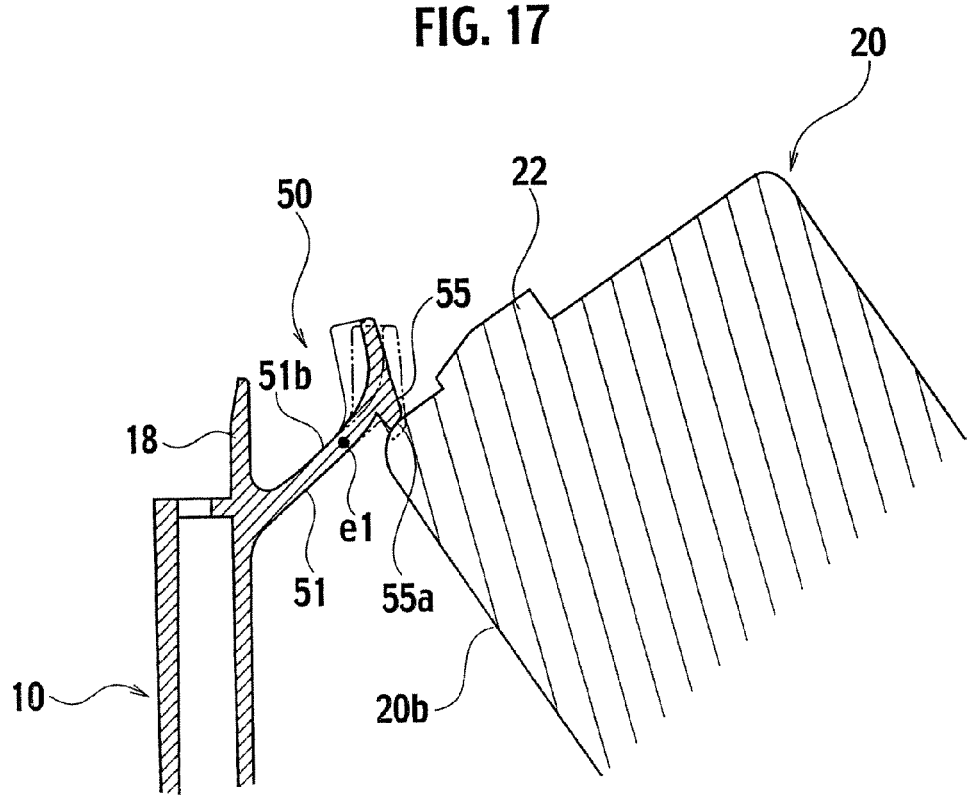

LOCK MECHANISM OF ELECTRIC CONNECTION BOX

BACKGROUND OF THE INVENTION

1. Field of the Invention

The present invention relates to a lock mechanism of an electric connection box which is mounted in an automobile and the like.

2. Description of the Related Art

An electric connection box for housing fuses, relays and other wire harness components is mounted in a vehicle. In the case where a body of such an electric connection box houses therein a separate part such as a fuse box, a lock unit configured to fix the separate part to the box body is provided therebetween as described in Japanese Unexamined Patent Publication No. 2004-312844 and Japanese Unexamined Patent Publication No. 2005-86865.

As an example of such a lock unit, a lock mechanism 150 shown in FIGS. 1A, 1B, 2A, and 2B includes a flexible lock arm 151 provided on an inner wall 118 of a box body 110, and is configured to fix a part 120, which is a counterpart component, to the box body 110 with a lock projection 155 on the flexible lock arm 151 engaged with the part 120.

The lock mechanism 150 includes: the lock arm 151 which is provided on the inner wall 118 of the box body 110 so as to protrude obliquely upward from the inner wall 118 in a cantilever manner; and the lock projection 155 which is provided to the lock arm 151 on the surface thereof facing the part 120 housed in a part compartment so as to protrude from the surface. The lock mechanism 150 is configured to lock the part 120 when putting the part 120 into the part compartment, as follows. Specifically, the lock arm 151 is temporarily bent due to the interference between the lock arm 151 and a portion of the part 120. Then, after the interference portion on the part 120 passes the lock projection 155, the lock arm 151 returns to the original state, whereby the lock projection 155 comes to engage with and locks the part 120. In a top view of the lock arm 151, a wall portion 155b, which is provided on the lock projection 155 and configured to engage with the part 120, protrudes a distance d from the top portion of the lock arm 151. Therefore, when the part 120 is inserted, the protruding part comes in contact with the part 120.

The lock arm 151 can be divided in the longitudinal direction thereof into: a base end region 151a which is fixed to the inner wall 118; upper end regions 151c and 151d located in the free end which interferes with the part 120 and receives pressure applied for unlocking operation; and a middle region 151b which is located within a predetermined distance range between the base end region 151a and the upper end regions 151c and 151d. The lock arm 151 having such a configuration is usually formed to have approximately the same flexural rigidity throughout all the regions.

In the lock arm 151 shown in the drawings, ribs 156 are provided on the lower surface in the base part attached to the inner wall 118. All the regions of the lock arm 151 except for the region having the ribs 156 formed therein are formed to have the cross section of a squared U shape with ribs 152 provided on the both edges of the plate-shaped lock arm 151. By employing such a configuration, the flexural rigidity of the entire lock arm 151 is set approximately uniform.

Accordingly, as shown in FIG. 2B, when a unlocking operation force F is applied to the upper end region of the lock arm 151, the whole lock arm 151 is tilted as indicated by an arrow C with the base end side as a supporting point. With the lock arm 151 in this state, the part 120 can be released from the lock projection 155, and therefore the part 120 can be pulled upwards.

However, in the case where all the regions of the lock arm 151 in a longitudinal direction thereof have the same flexural rigidity as described above, the approximately entire lock arm 151 is to be bent according to a certain spring constant until the amount of elastic displacement reaches an elastic bending limit N4 as shown in a characteristic chart diagram in FIG. 3 illustrating the relationship between a force (a force required for locking and unlocking operations) and the amount of elastic displacement (the amount of bending of the lock arm 151). Accordingly, such a configuration raises a problem that a larger force will have to be applied for locking and unlocking operations if the flexural rigidity of the lock arm 151 is increased in order to enhance the lock retention. The configuration also raises a problem, on the other hand, that the lock retention will be weakened if the flexural rigidity of the lock arm 151 is reduced so as to eliminate the need for applying a large force for locking and unlocking operations. Hence, there has been a trade-off between the operability for locking and unlocking and the lock retention in a locked state.

SUMMARY OF THE INVENTION

Having been conducted in view of solving the above-described problems in the related art, it is an object of the present invention to provide a lock mechanism which allows not only an improvement of the operability for locking and unlocking but also an enhancement of lock retention in a locked state in an electric connection box.

An aspect of the present invention is a lock mechanism of an electric connection box, comprising: a box body including a part compartment for housing a part; a lock arm provided on an inner wall of the part compartment in a cantilever manner so as to protrude from the inner wall, the lock arm being bent due to an interference between the lock arm and the part when the part is put into the part compartment; and a lock projection provided to a surface of the lock arm facing the part housed in the part compartment, the lock projection being engaged with the part due to a returning action of the lock arm to an original state after the part has passed through the lock projection interfering with the lock projection, wherein the lock arm has in a longitudinal direction of the lock arm: a base end region located in a base end of the lock arm fixed to the inner wall of the part compartment; an upper end region located in a free end which interferes with the part and receives a pressing force applied for unlocking operation; and a middle region located within a predetermined distance range between the base end region and the upper end region, wherein a flexural rigidity of the middle region is smaller than flexural rigidities of the base end region and the upper end region.

For example, in the case where all the regions of the lock arm which are aligned in a longitudinal direction thereof have a uniform flexural rigidity, the approximately entire lock arm is to be bent in both the locking operation and unlocking operation. Accordingly, if the flexural rigidity of the lock arm is increased in order to enhance the lock retention, a larger force will have to be applied for locking and unlocking operations. On the other hand, if the flexural rigidity of the lock arm is reduced so as to eliminate the need for applying a large force for locking and unlocking operations, the lock retention will be weakened. Hence, the operability for locking and unlocking operations and the lock retention in a locked state have been regarded as having a trade-off relationship.

In that respect, the above-described aspect of the present invention is capable of improving both the operability for locking and unlocking operations and the lock retention in a locked state.

In the case where an upper end part, a middle part, and a base end part of a cantilever lock arm have the same amount of flexural deformation, an amount of flexural displacement of the upper end part, which is a free end, will be larger than that of the middle part, and an amount of flexural displacement of the middle part will be larger than that of the base end part. Accordingly, it is possible to easily achieve a desired amount of displacement of the upper end side (an amount of displacement required for locking and unlocking) by reducing the flexural rigidity of the base end side (making the base end side softer). Such a configuration, however, reduces the overall reaction force of the lock arm, and, as a result, the lock retention is reduced in a locked state although it is easier to insert a part to be locked by the lock arm.

On the other hand, if the flexural rigidity of the upper end region is reduced (the upper end region is made softer), only the upper end part will be caused to have flexural deformation first, and therefore the deformation will be less likely to be transferred to the middle part; thus, it is difficult to achieve a desired amount of displacement at the upper end side.

According to the above-described aspect of the present invention, it is configured that the flexural rigidity of the middle region is smaller than the flexural rigidity of the upper end region and the base end region. Therefore, the middle region can be deformed from the early stage of the application of a small amount of force for bending the lock arm. In such a configuration, it is possible to gain a larger amount of displacement at the upper end region on the free end side than at the middle region (although the upper end region itself is not deformed). Then, having the base end region to be mainly caused to have flexural deformation at the end of the flexural deformation, it is possible to gain a large amount of displacement at the upper end region; thus, locking and unlocking operations with use of a lock projection can be performed.

In other words, according to the aspect of the present invention, it is possible to gain a large amount of displacement at the upper end side with application of a small amount of force in the early stage (initiation stage) of lock arm flexure in a process of bending the lock arm; thus, only a small operation force is necessary for the insertion of a part. Furthermore, through the middle stage to the final stage in which the insertion gains momentum, although an amount of displacement of the upper end side cannot be as large as that in the initiation stage, a large reaction force can be generated in the lock arm. Hence, it is possible to obtain enhanced lock retention in a final state where a part is locked in a compartment.

As described above, the base end region, the middle region, and the upper end region of the lock arm which are aligned in a longitudinal direction thereof have different spring constants. In such a configuration, in a process of bending the lock arm, a main flexural portion can be sequentially shifted among the regions once an amount of bending reaches a spring elastic bending limit of the individual regions. Therefore, it is possible to improve both the operability for assembling a part to the lock arm and the lock retention. It is also possible to reduce a chance of the lock arm being destroyed.

The lock arm may have a plate-like shape, and the flexural rigidities of the base end region and the upper end region of the lock arm may be larger than the flexural rigidity of the middle region by integrally providing ribs on plate surfaces of the end region and the upper end region of the lock arm, the ribs extending in a longitudinal direction of the lock arm and having a projection height gradually decreasing as the ribs approach the middle region.

In the above-described configuration, the flexure rigidity in the base end region and the upper end region in the lock arm is made larger than that in the middle region by providing ribs in the base end region and the upper end region. Therefore, it is possible to properly adjust the flexure rigidity by changing the number and/or the thickness of ribs.

The lock projection may be formed on a surface of the upper end region facing the part housed in the part compartment, include a wall portion for engaging with the part, and include a convex curved surface portion for promoting a relative sliding movement between the part and the lock projection being interfered with each other.

In the configuration described above, it is possible to smoothly insert a part into a part compartment in a box body. To be more specific, when the lock arm is bent due to the interference with the part to be inserted, the part eventually comes to interfere with a lock projection. During the interference, a movement of the part in association with the lock projection can be smooth. Furthermore, it is possible to convert a movement of the part in association with the lock projection into a movement of the part bending the lock arm; thus, the part can be inserted more easily.

A supporting member for rotatably supporting the part with one end wall of the part as a supporting point may be provided on one side of the inner wall of the part compartment, and the lock arm may be provided on another one side of the inner wall of the part compartment.

In the configuration described above, a first end side of a part is arranged to face a first inner wall of the part compartment and caused to come in contact with a supporting member, the part is rotated around the supporting member as a supporting point, and then the part is more strongly pushed into the part compartment while a second end side of the part is pressed onto the lock arm. As a result, the second end side of the part can be engaged with the lock arm. Hence, it is possible to lock the first end side and the second end side of the part easily and securely.

BRIEF DESCRIPTION OF THE DRAWINGS

FIG. 1A is a perspective view from the side where a part is to be located, while FIG. 1B is a perspective view from the opposite side of FIG. 1A.

FIG. 2A is a side view of the lock arm with a part locked therein, while FIG. 2B is a side view of the lock arm being bent in an unlocked state.

FIG. 16 is a cross-sectional view for explaining how the lock mechanism works in the process of housing a part.

FIG. 17 is a cross-sectional view of the next step after the step illustrated in FIG. 16.

DESCRIPTION OF THE PREFERRED EMBODIMENT

Figure 1A:
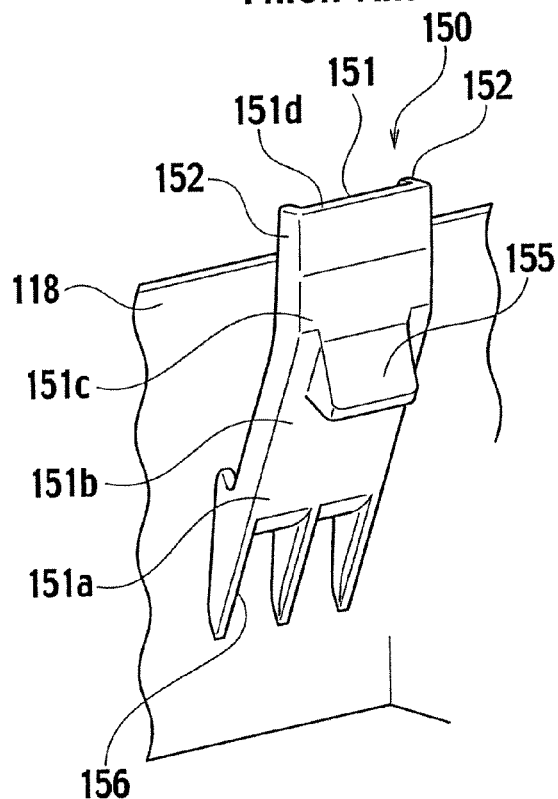
FIGS. 1A and 1B are explanatory drawings of a related lock arm.
Figure 1B:
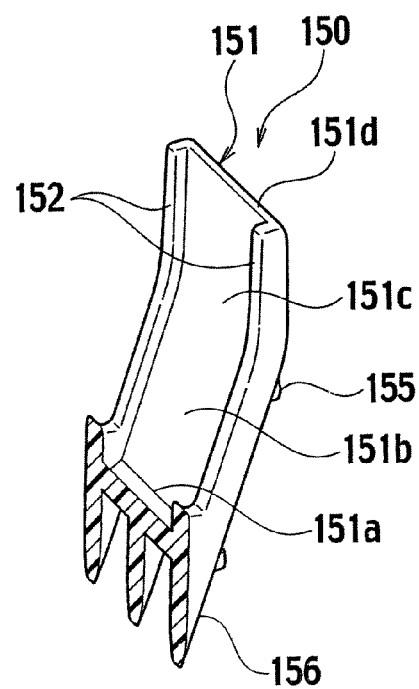
Figure 2A:
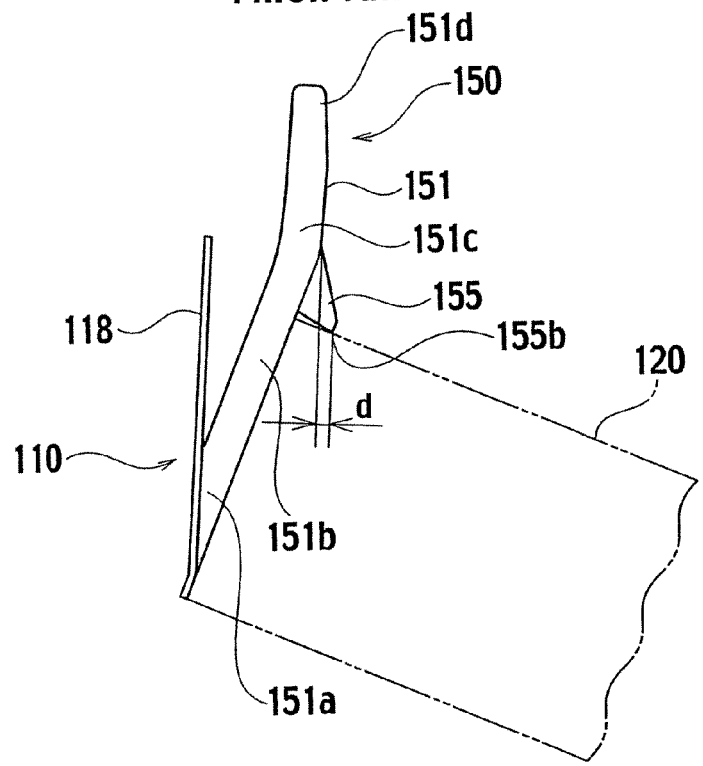
FIGS. 2A and 2B are explanatory drawings illustrating how the related lock arm is caused to have flexural deformation.
Figure 2B:
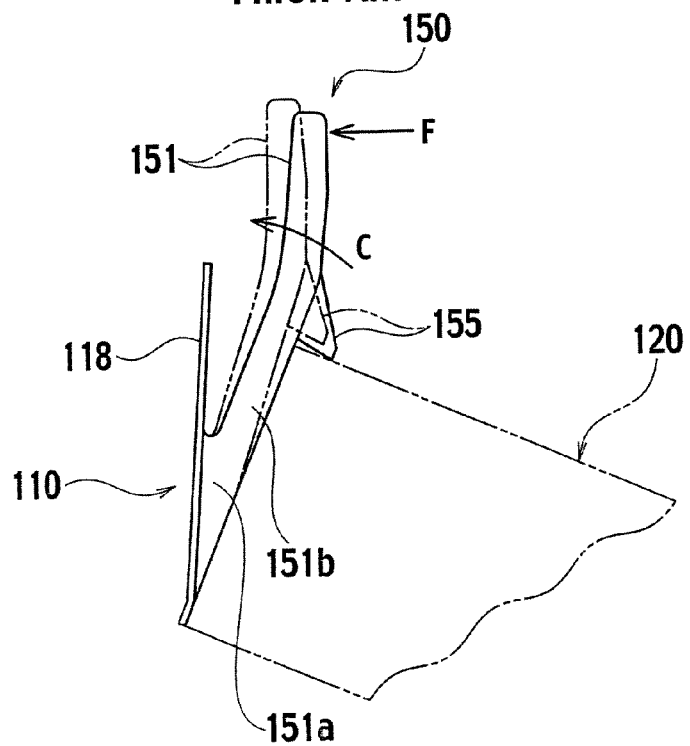
Figure 3:
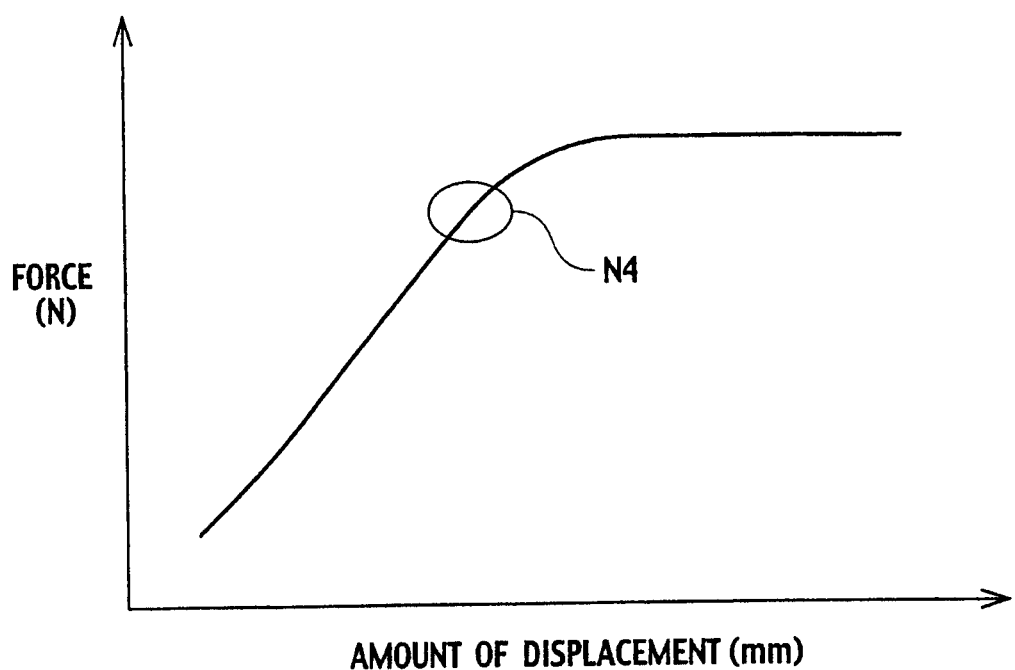
FIG. 3 is a characteristic chart showing the relationship between an amount of flexure displacement of the related lock arm and a force applied to the related lock arm.

Hereinafter, an embodiment of the present invention will be described by referring to drawings. In the following drawings, the same or similar parts are denoted by the same or similar reference numerals.

Figure 4:
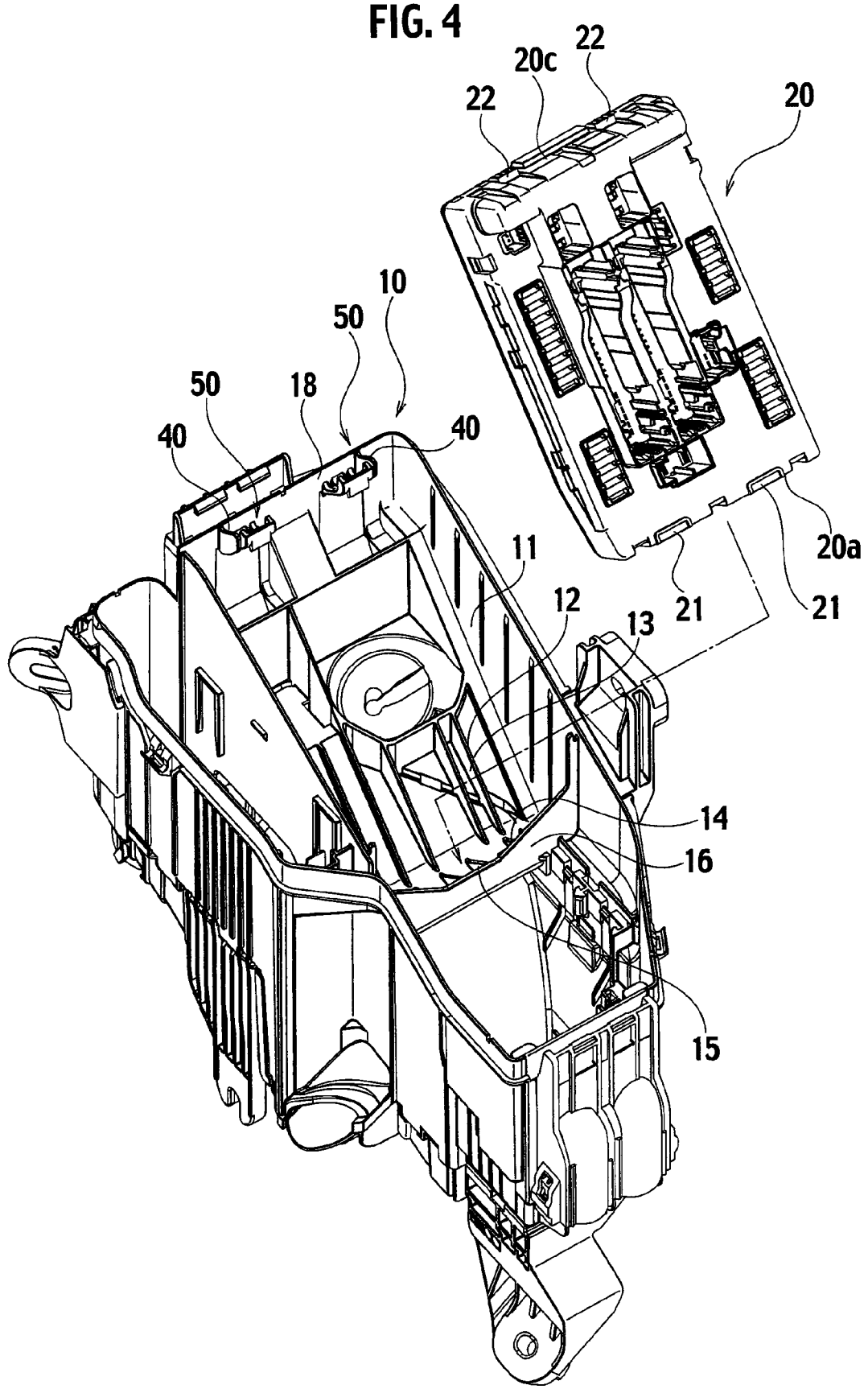
FIG. 4 is an upper perspective view of an electric connection box employing a lock mechanism according to an embodiment of the present invention.
Figure 5:
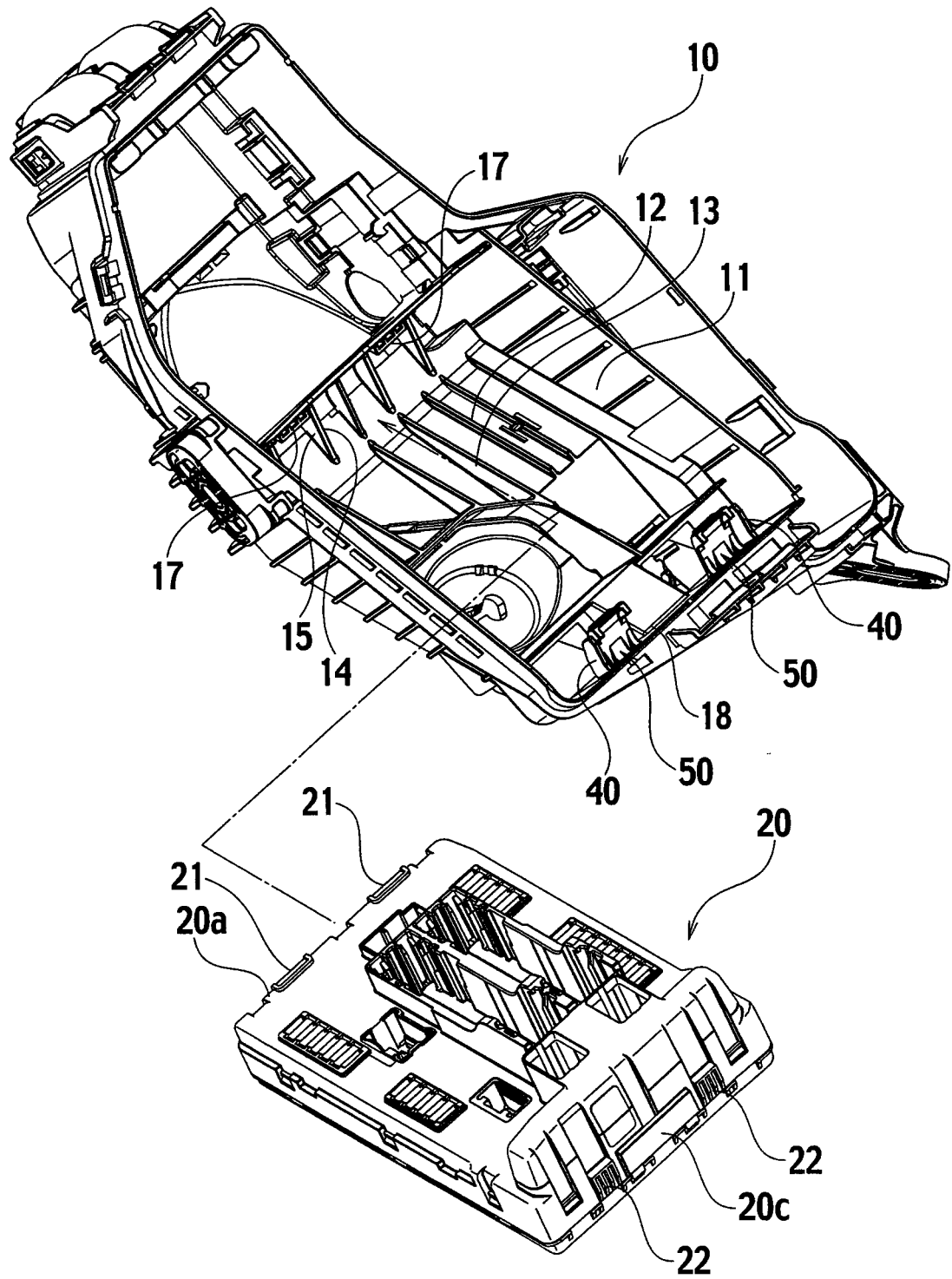
FIG. 5 is a perspective view of the electric connection box employing the lock mechanism according to the embodiment of the present invention from an angle different from that in FIG. 4.
Figure 6:
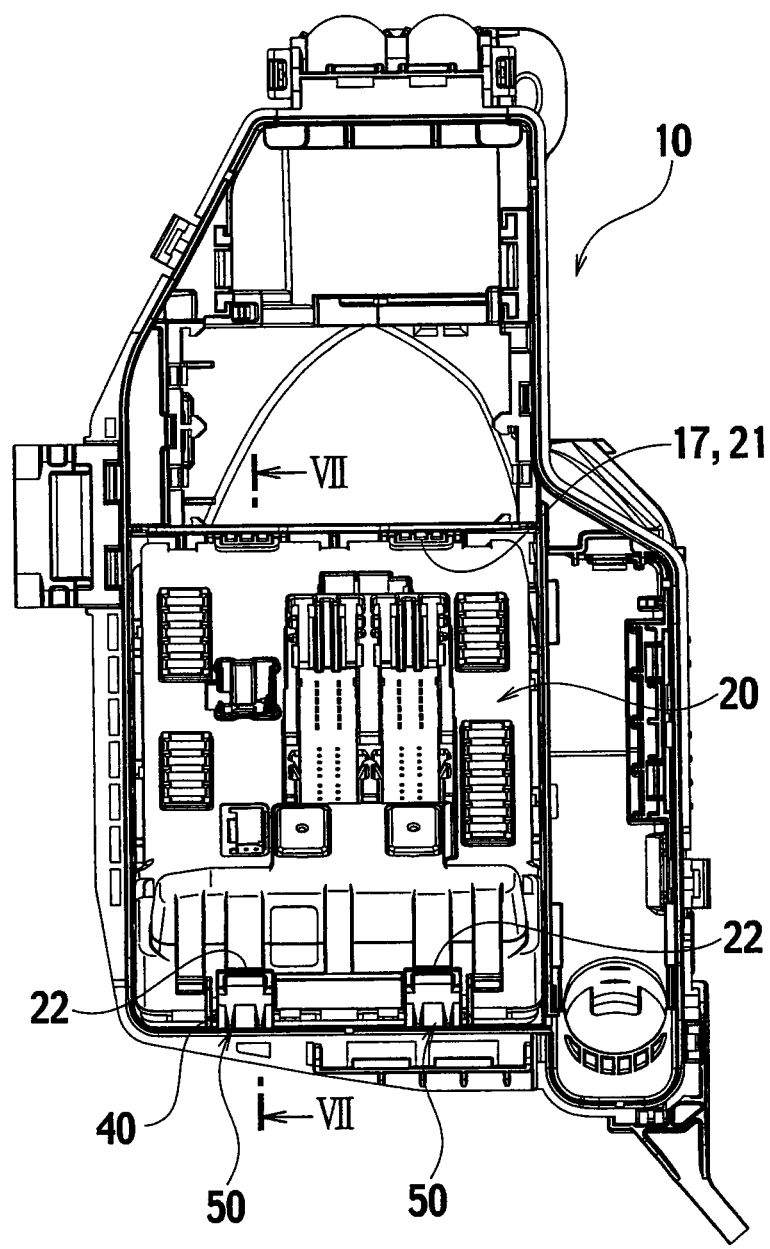
FIG. 6 is a plan view of the electric connection box employing the lock mechanism according to the embodiment of the present invention in a state of being assembled.
Figure 7:
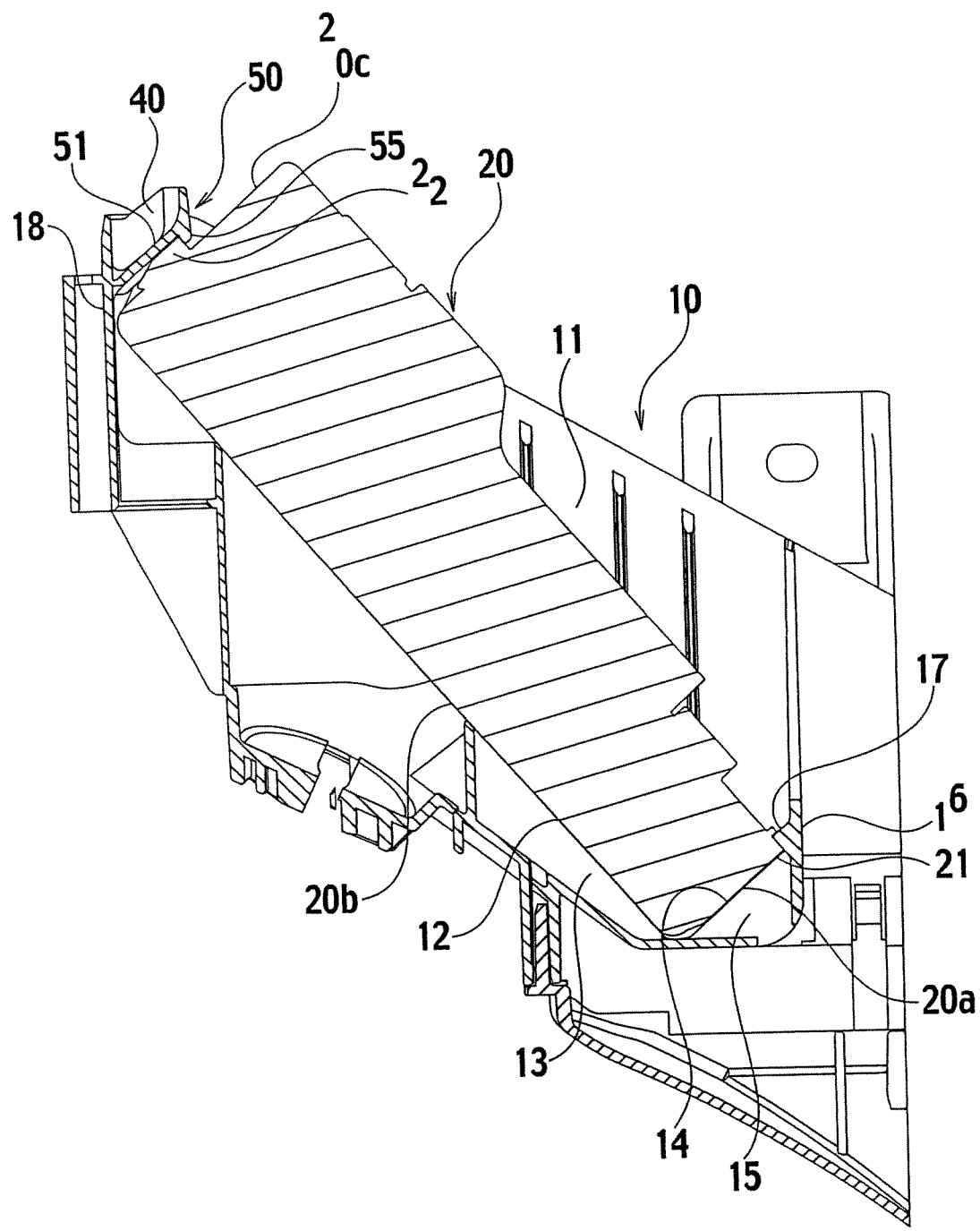
FIG. 7 is a cross-sectional view taken along the line VII-VII in FIG. 6.
Figure 8:
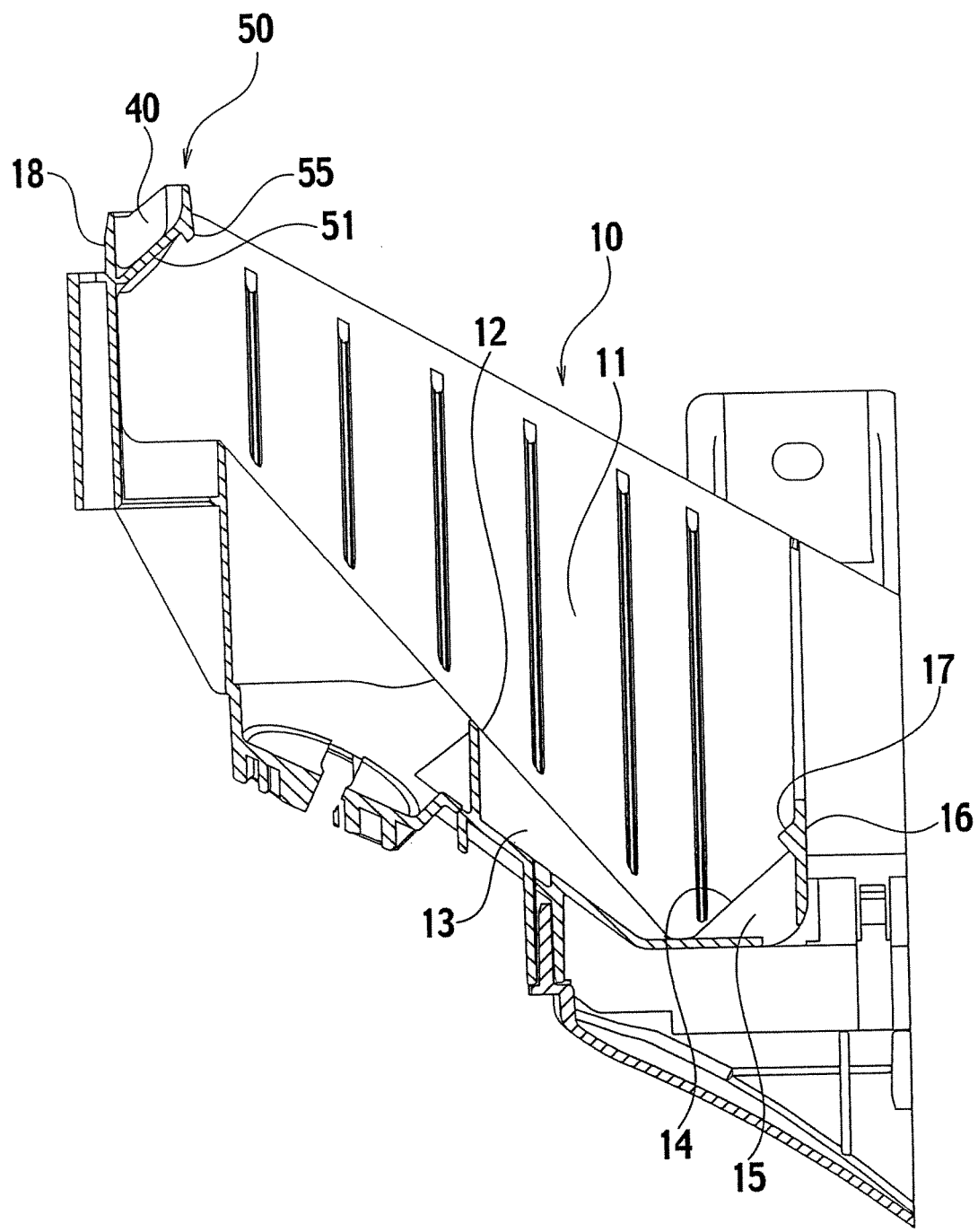
FIG. 8 is a drawing of FIG. 7 before a part is housed.
Figure 9:
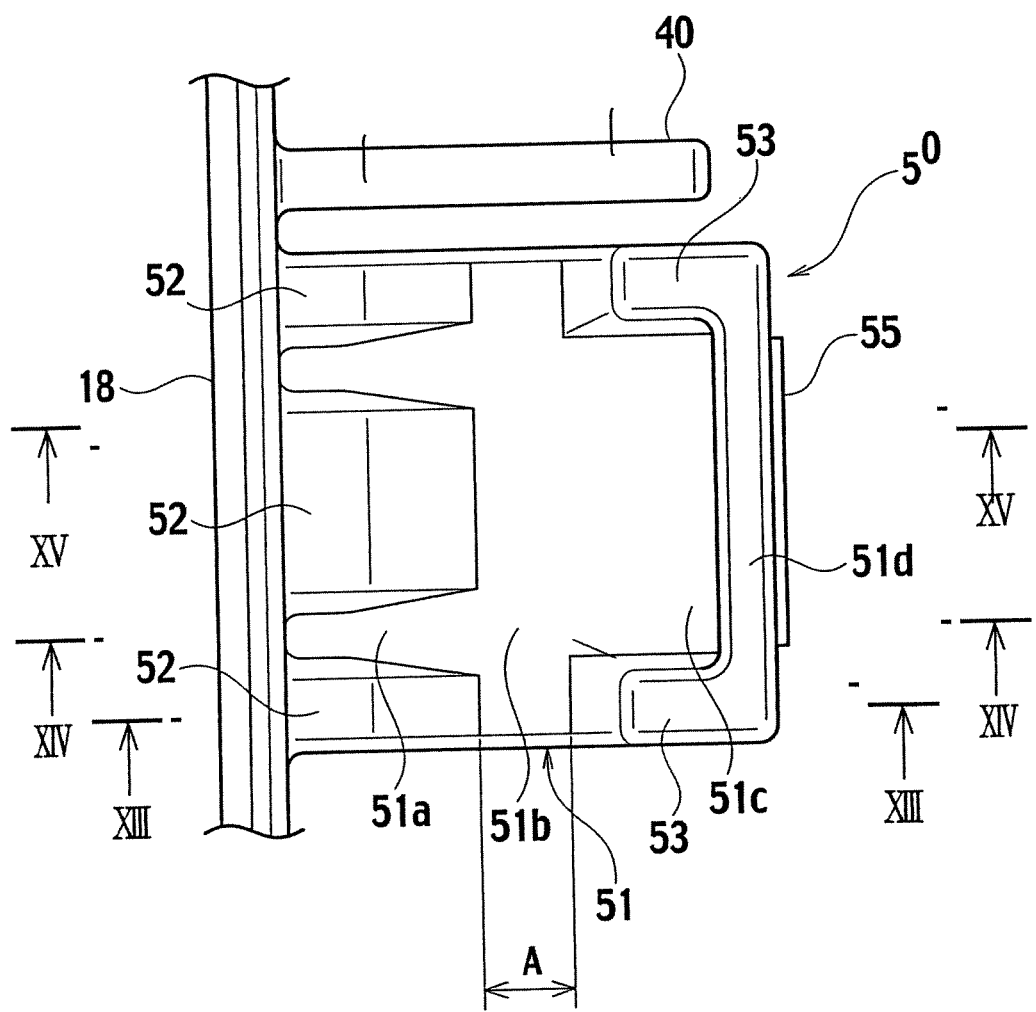
FIG. 9 is a plan view of a lock unit on a box body.
Figure 10:
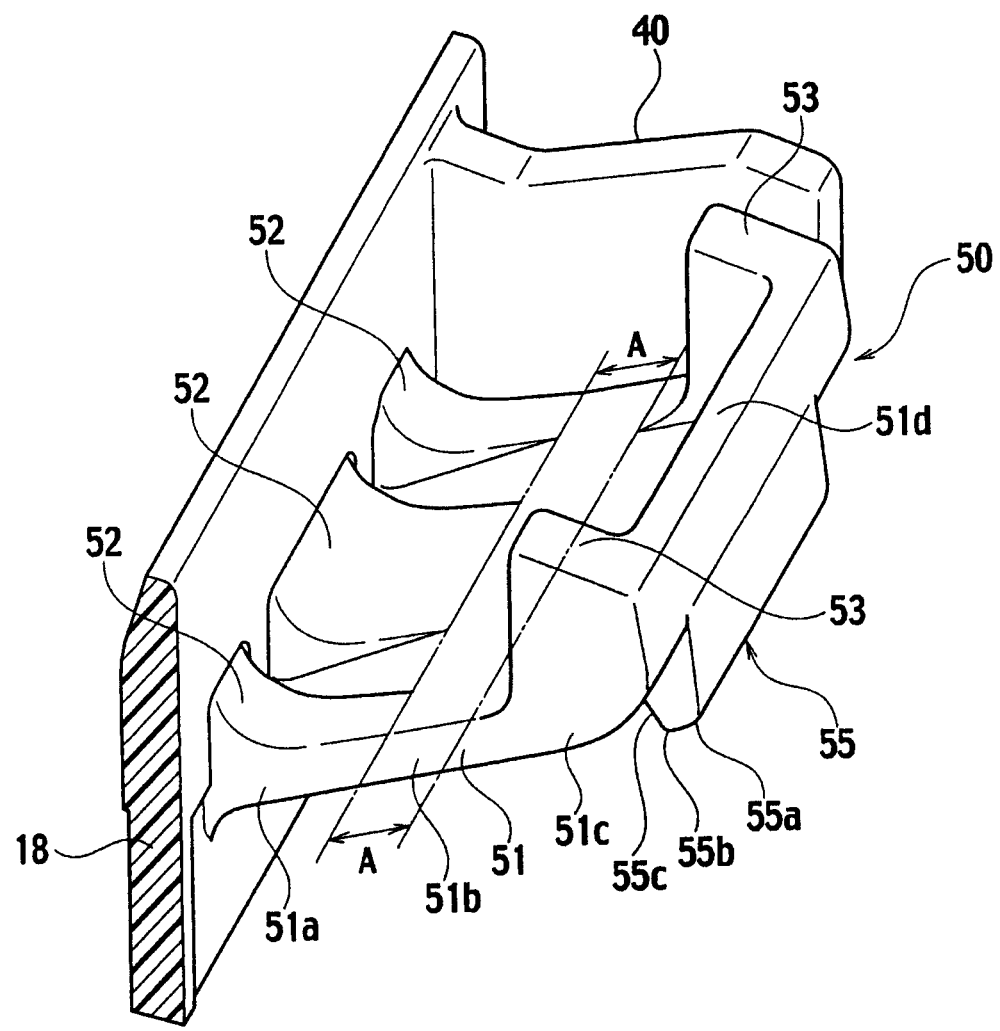
FIG. 10 is an upper perspective view of the lock unit on the box body.
Figure 11:
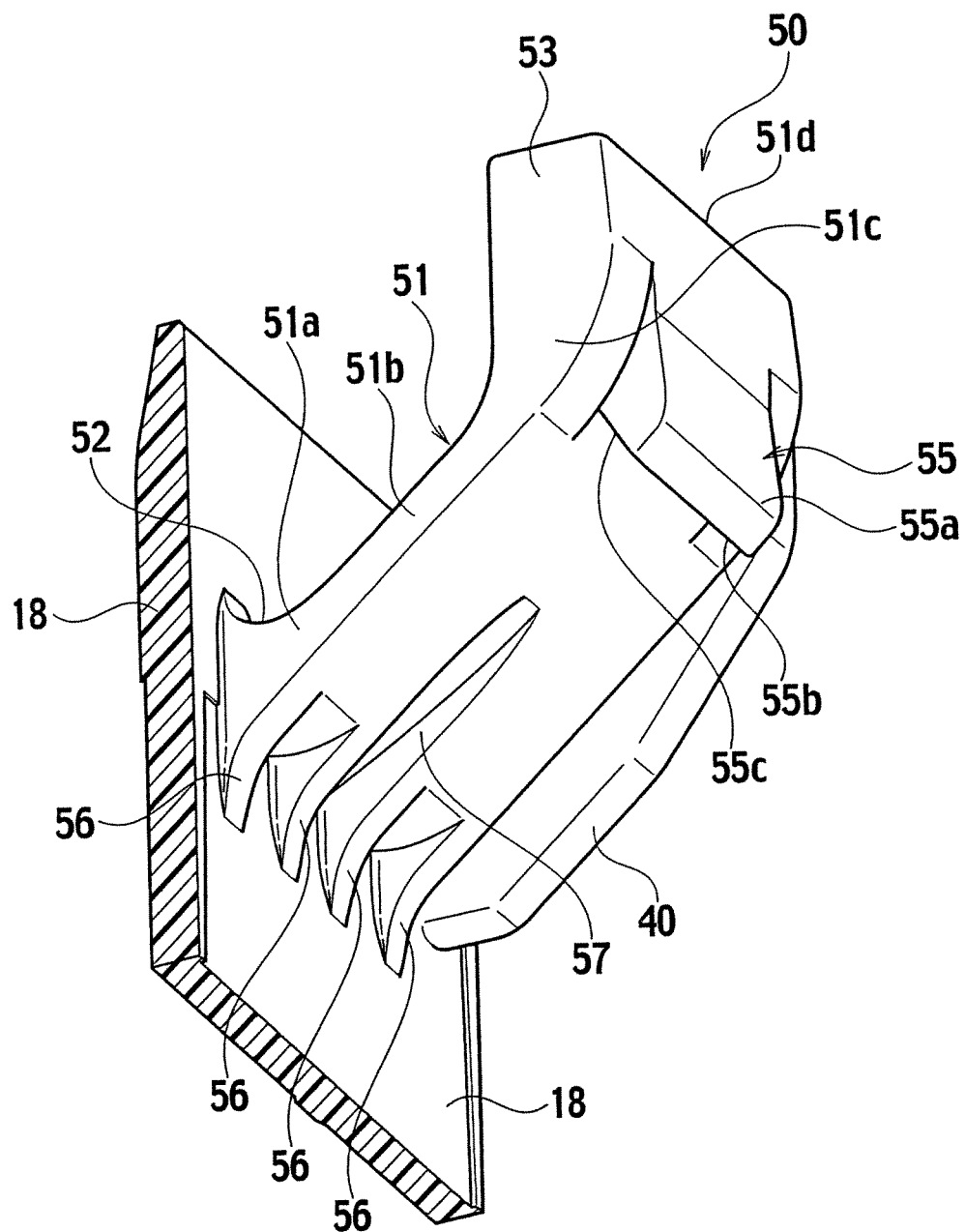
FIG. 11 is a bottom perspective view of the lock unit of the box body.
Figure 12:
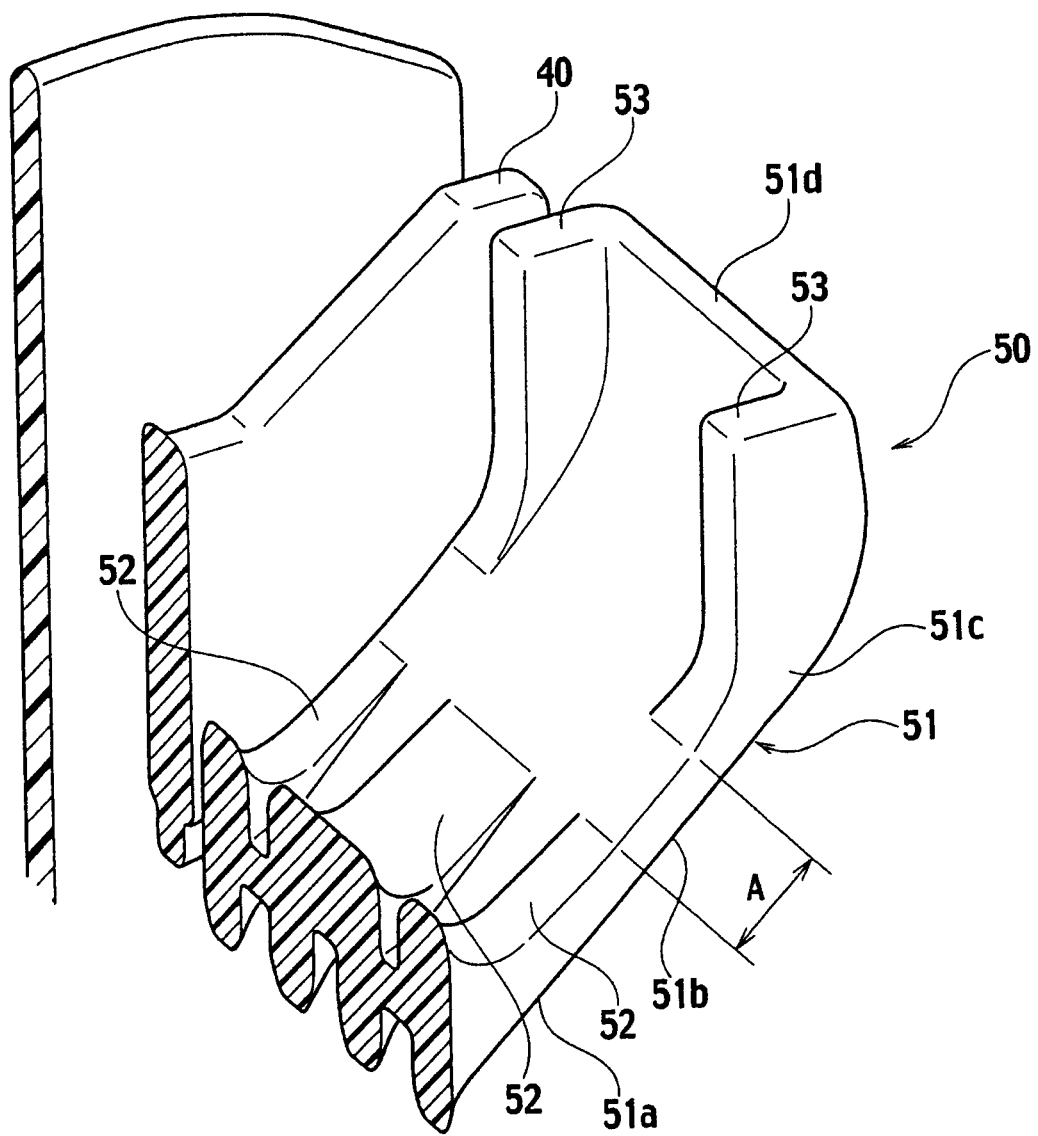
FIG. 12 is an upper perspective view of the lock unit on the box body from an angle different from that in FIG. 10.
Figure 13:
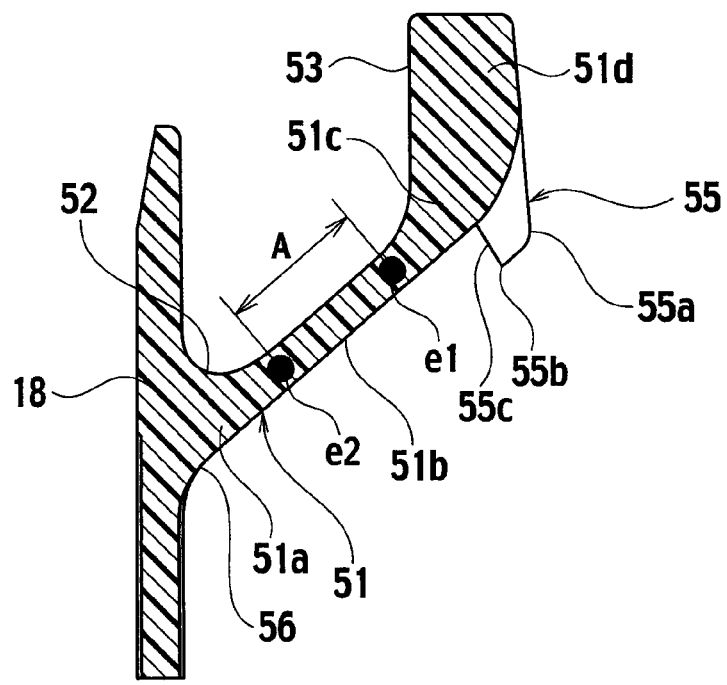
FIG. 13 is a cross-sectional view taken along the line XIII-XIII in FIG. 9.
Figure 14:
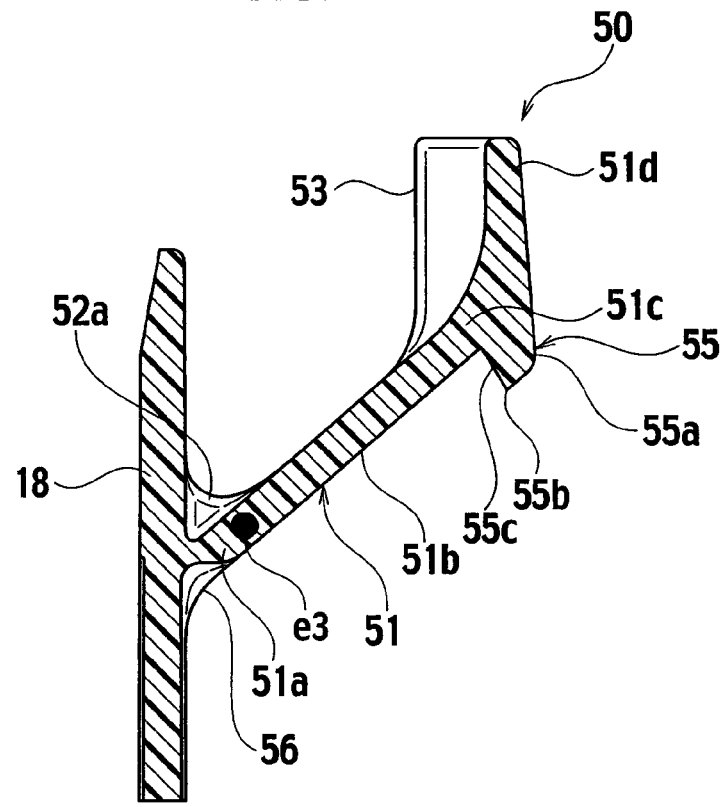
FIG. 14 is a cross-sectional view taken along the line XIV-XIV in FIG. 9.
Figure 15:
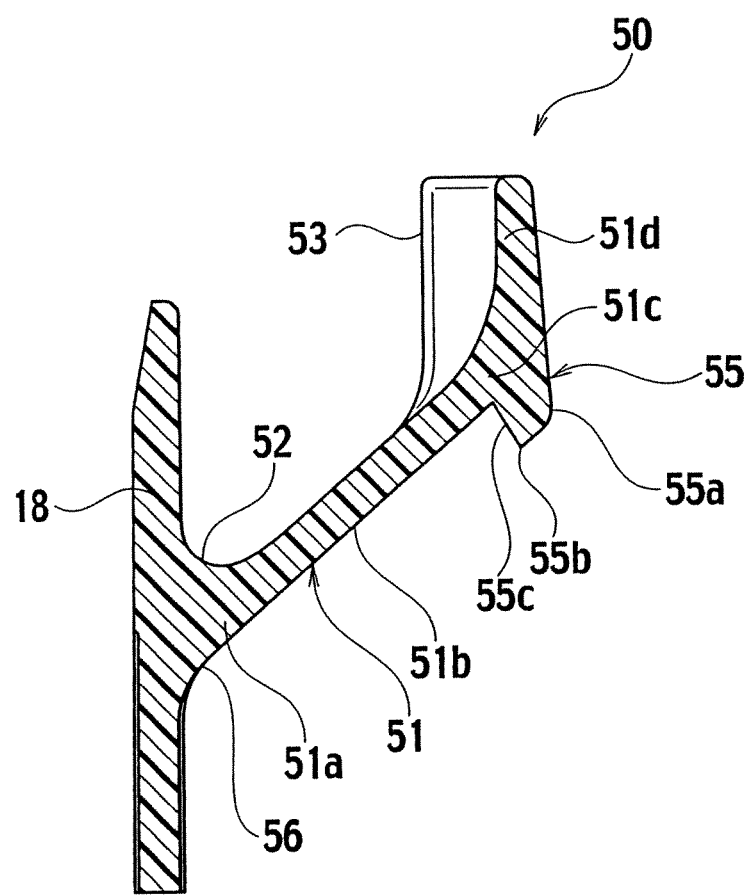
FIG. 15 is a cross-sectional view taken along the line XV-XV in FIG. 9.

FIG. 4 is an upper perspective view of an electric connection box employing a lock mechanism according to an embodiment of the present invention, and FIG. 5 is a perspective view of the electric connection box from an angle different from that in FIG. 4. FIG. 6 is a plan view of the electric connection box in a state of being assembled. FIG. 7 is a cross-sectional view taking along the line VII-VII in FIG. 6. FIG. 8 is a drawing of FIG. 7 before a part is housed. FIGS. 9, 10, and 11 are a plan view, an upper perspective view, and a bottom perspective view, respectively, of a lock unit on a box body. FIG. 12 is an upper perspective view of the lock unit from an angle different from that in FIG. 10. FIGS. 13, 14, and 15 are cross-sectional views taken along the line XIII-XIII, XIV-XIV, and XV-XV, respectively, in FIG. 9.

As shown in FIGS. 4 to 6, the electric connection box is composed of a box body 10 made of a resin compact having a part compartment 11 formed therein and an electronic unit (part) 20 to be housed in the part compartment 11. The electronic unit 20 is a unit in which various electronic parts are mounted in a rectangular box-shaped casing. In the electronic unit 20, at least a first end wall 20*a*, a bottom wall 20*b*, and a second end wall 20*c* (see FIG. 7) are formed on a flat surface.

As shown in FIG. 7, a first inner wall 16 of the part compartment 11 in the box body 10 is provided with an end wall positioning member 14 which the first end wall 20*a* of the electronic unit 20 is pushed against. At the bottom part of the part compartment 11, a bottom wall mounting member 12 is provided for mounting the bottom wall 20*b* of the electronic unit 20. The end wall positioning member 14 and the bottom wall mounting member 12 are formed by ridges of multiple ribs 15 and 13, respectively.

As shown in FIG. 7, an engaging projection (supporting member) 17 is provided at the upper part of the end wall positioning member 14 so as to be engaged with an upper end 21 on the first end wall 20*a* of the electronic unit 20. A lock arm 51 constituting a main lock unit 50 is provided on a second inner wall 18 of the part compartment 11 in the box body 10. A lock protecting wall 40 is provided next to the lock arm 51 with a distance therebetween. The lock arm 51 and the lock protecting wall 40 are formed on the inner wall 18 and protruding therefrom. The lower part of the first end wall 20*a* of the electronic unit 20 is caused to slide on the bottom wall mounting member 12, while the upper end 21 of the first end wall 20*a* of the electronic unit 20 is caused to slide on the end wall positioning member 14, so that the upper end 21 of the first end wall 20*a* of the electronic unit 20 is engaged with the engaging projection 17. As a result, the rotation of the electronic unit 20 is completed, and, at the same time, the second end wall 20*c* of the electronic unit 20 comes to be engaged with the lock arm 51.

As shown in FIG. 5, the second end wall 20*c* of the electronic unit 20 is provided with a convex portion 22 to be engaged with the lock arm 51. As shown in FIG. 16, the convex portion 22 in this case has a front end wall 22*a*, an angular wall 22*b*, a flat wall 22*c*, and a rear end wall 22*d*.

The part compartment 11 of the box body 10 is configured so as to accommodate the rectangular box-shaped electronic unit 20 in an inclined position relative to the horizontal plane. The end wall positioning member 14 and the bottom wall mounting member 12 are formed so as to be able to stably support the electronic unit 20 housed in an inclined position. In this case, the direction of the inclination is set by arranging the side where the engaging projection 17 is mounted at the lower side of the inclination and the side where the lock arm 51 is mounted at the upper side of the inclination.

The inner wall 18 located at the upper side of the inclination where the lock arm 51 is mounted is formed to be a substantially perpendicular wall. Accordingly, the lock arm 51 is formed in a cantilever manner such that one side thereof extends obliquely upward from the inner wall 18. A lock projection 55 is formed on the bottom surface of the lock arm 51 so as to provide a protrusion thereon.

The lock arm 51 is divided into the following regions in a longitudinal direction thereof: a base end region 51*a* which is fixed to the inner wall 18 of the part compartment 11; upper end regions 51*c* and 51*d* located in the free end which interfere with the electronic unit 20 and receive a pressing force applied for unlocking operation; and a middle region 51*b* which is located within a predetermined distance range between the base end region 51*a* and the upper end regions 51*c* and 51*d*. The flexural rigidity of the middle region 51*b* is set to be smaller than that of the base end region 51*a* and the upper end regions 51*c* and 51*d*.

The lock arm 51 has a plate-like shape. On the plate surfaces in the base end region 51*a* as well as the upper end regions 51*c* and 51*d* of the plate-shaped lock arm 51, front-surface-side ribs 52 and 53 as well as back-surface-side ribs 56 are integrally formed. The ribs 52, 53, and 56 are formed to extend along a longitudinal direction of the lock arm 51 and have a projection height gradually decreasing towards the middle region 51*b*. By providing the ribs 52, 53, and 56 having such a configuration, the flexural rigidity of the base end region 51a and the upper end regions 51c and 51d are set to be larger than that of the middle region 51b. A groove 57 is formed in the middle part of the bottom surface of the lock arm 51 to prevent strain during molding process.

In this case, the lock arm 51 extends linearly from the middle region 51b to the upper end region 51c, and extends perpendicularly from the upper end region 51c to the upper end region 51d located thereabove. The lock arm 51 is further provided with the lock projection 55 formed in the upper end region 51c on the surface facing the electronic unit 20. On the lock projection 55, a convex curved surface portion 55a (R portion) is provided for promoting a relative sliding movement between the electronic unit 20 and the lock projection 55 when they come to interfere with each other. The lock projection 55 includes wall portions 55b and 55c.

By having such a configuration, supporting points e1, e2 and e3 are disposed in the lock arm 51 as shown in FIGS. 13 and 14 on the occurrence of multiple flexural deformations.

Next, the action mechanism of the lock arm 51 will be described.

Figure 20:
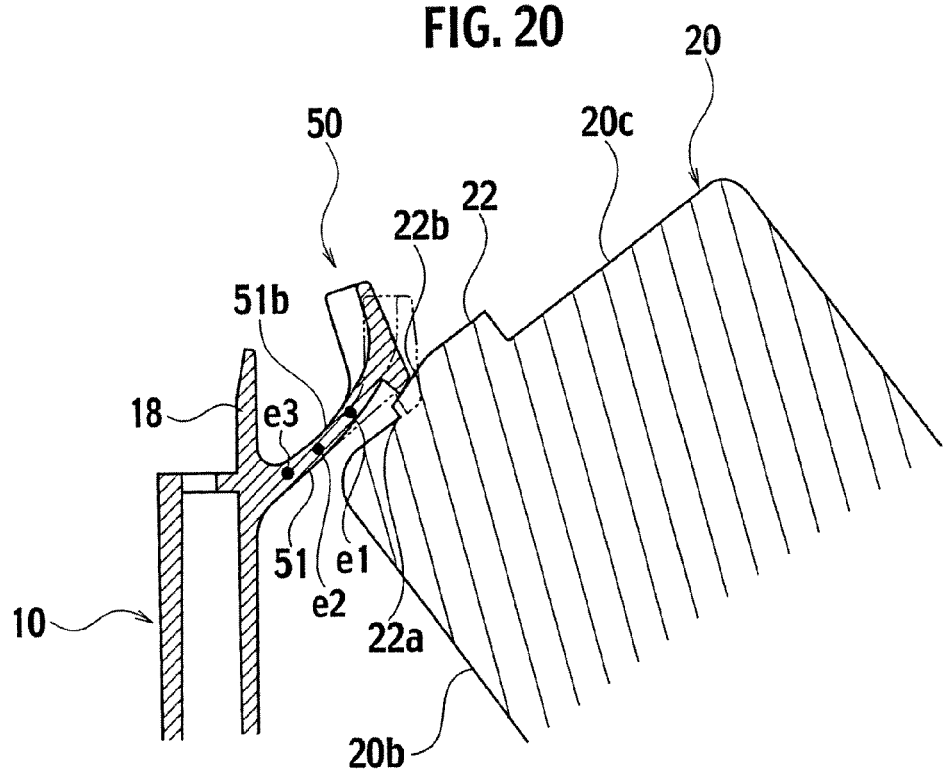
FIG. 20 is a cross-sectional view of the next step after the step illustrated in FIG. 19.
Figure 21:
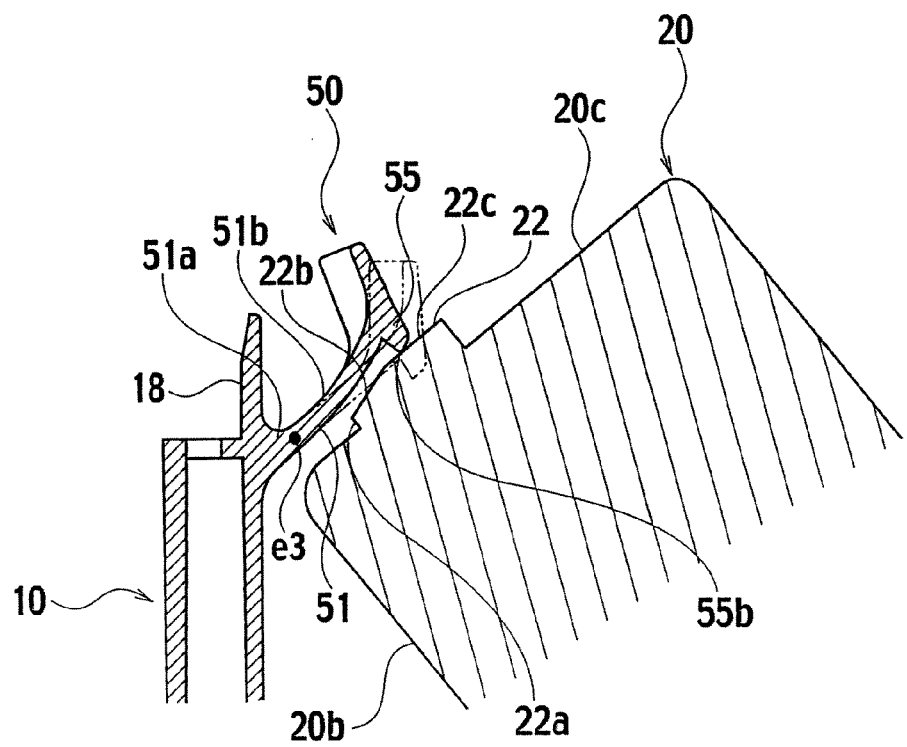
FIG. 21 is a cross-sectional view of the next step after the step illustrated in FIG. 20.
Figure 22:
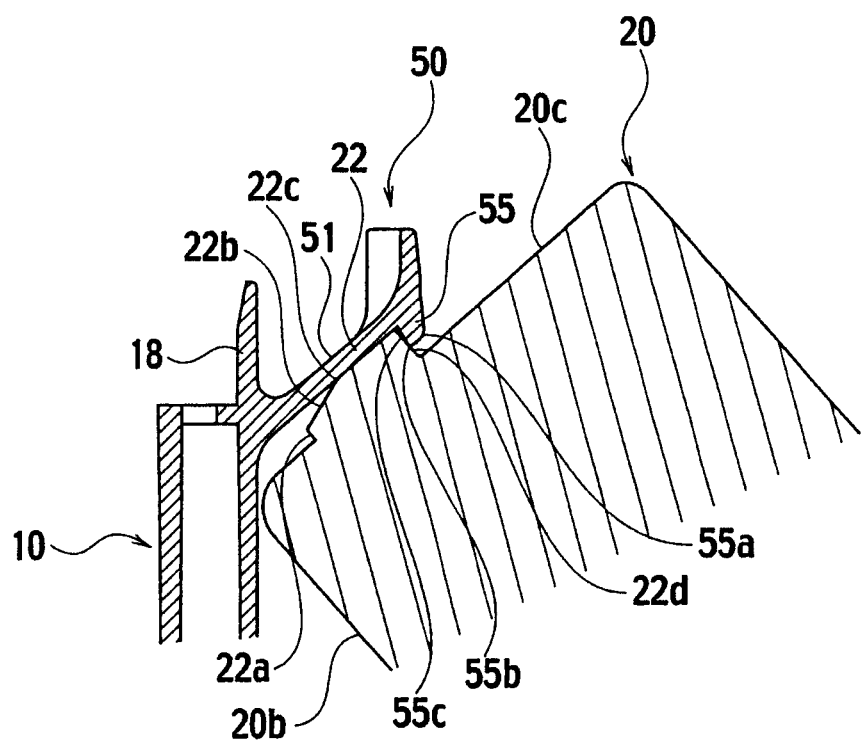
FIG. 22 is a cross-sectional view of the next step in which a locked state is achieved after the step illustrated in FIG. 21.

FIG. 16 is a cross-sectional view for explaining how the lock mechanism works in the process of housing a part. FIG. 17 is a cross-sectional view of the next step after the step illustrated in FIG. 16, FIG. 18 is a cross-sectional view of the next step after the step illustrated in FIG. 17, FIG. 19 is a cross-sectional view of the next step after the step illustrated in FIG. 18, FIG. 20 is a cross-sectional view of the next step after the step illustrated in FIG. 19, FIG. 21 is a cross-sectional view of the next step after the step illustrated in FIG. 20, and FIG. 22 is a cross-sectional view of the next step in which a locked state is achieved after the step illustrated in FIG. 21.

In the case where the electronic unit 20 is housed in the part compartment 11 of the box body 10, the electronic unit 20 is firstly rotated with the first end wall 20a serving as a supporting point as shown in FIG. 7, and then the electronic unit 20 is more strongly pushed down while the second end wall 20c of the electronic unit 20 is pushed against the lock arm 51. As a result, the upper end 21 of the first end wall 20a of the electronic unit 20 is caused to face the first inner wall 16 of the part compartment 11 and to be engaged with the engaging projection 17, while the convex portion 22 on the second end wall 20c of the electronic unit 20 is caused to be engaged with the lock projection 55 on the lock arm 51.

Figure 18:
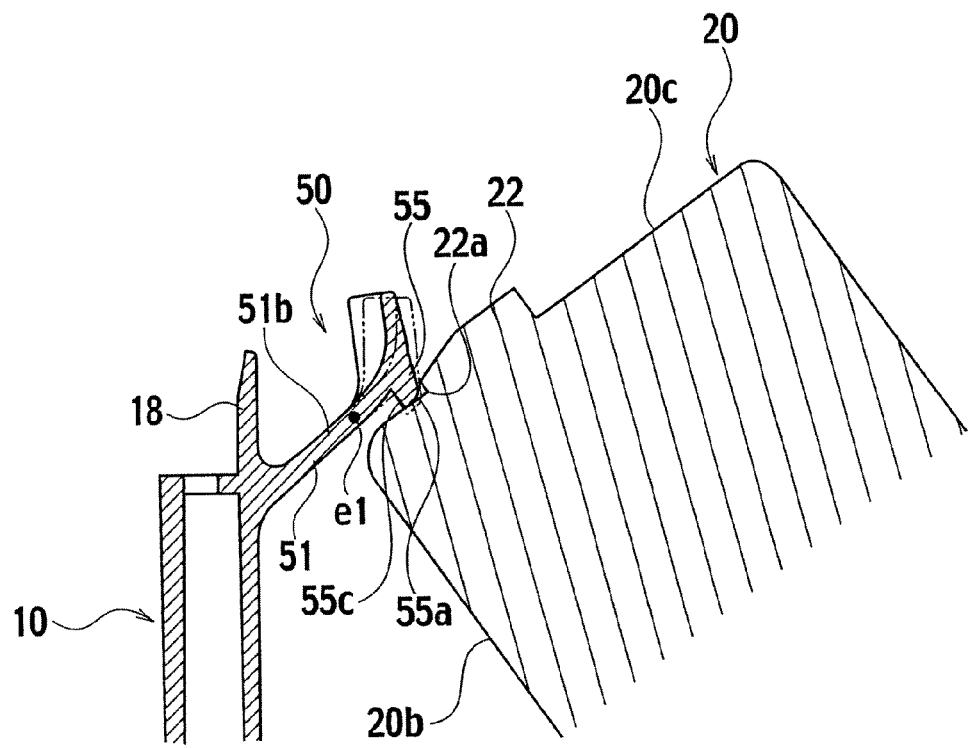
FIG. 18 is a cross-sectional view of the next step after the step illustrated in FIG. 17.

In the course of the engagement, after going through the steps illustrated in FIGS. 16 to 22, the lock projection 55 on the lock arm 51 is engaged with the convex member 22 on the electronic unit 20. Firstly, as the second end side of the electronic unit 20 is rotated downwardly, as shown in FIGS. 16, 17, and 18, the bottom square end portion of the electronic unit 20 comes in contact with the convex curved surface portion 55a of the lock projection 55, resulting in tilting the lock arm 51 towards the inner wall 18. At this early stage, the lock arm 51 is bent with the point e1 located in the upper end side of the middle region 51b.

Figure 19:
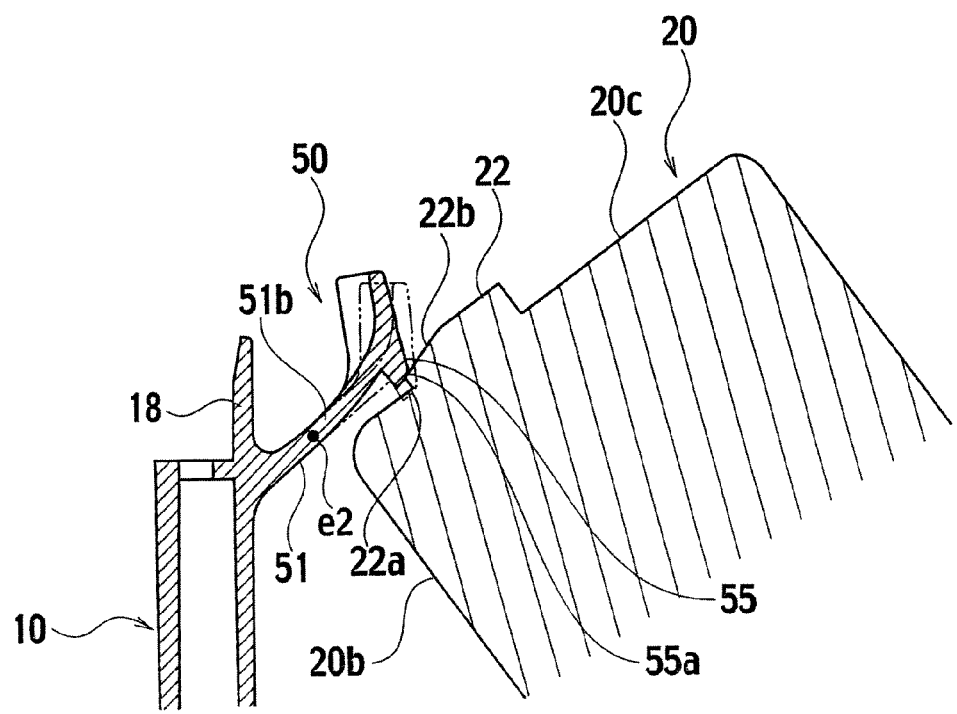
FIG. 19 is a cross-sectional view of the next step after the step illustrated in FIG. 18.

Next, as shown in FIG. 19, when the front end wall 22a of the convex member 22 of the electronic unit 20 comes in contact with the lock projection 55, a further pressing force acts on the lock arm 51, and, as a result, the lock arm 51 starts to be largely bent with the point e2 located in the base end side of the middle region 51b serving as a flexural center. Subsequently, after the lock projection 55 goes over the front end wall 22a, and then goes onto the angular wall 22b of the convex member 22, as shown in FIG. 20, the lock arm 51 is further bent with the point e3 serving as a supporting point in the base end region 51a. When the lock projection 55 moves on the flat wall 22c as shown in FIG. 21, the lock arm 51 is maximally bent. Thereafter, after the lock projection 55 passes the flat wall 22c as shown in FIG. 22, the lock projection 55 is released. As a result, the lock arm 51 returns to the original state due to its elasticity, and thereby the wall portions 55b and 55c of the lock projection 55 are engaged with the rear end wall 22d of the convex portion 22 of the electronic unit 20. Hence, a locked state is achieved.

Figure 23:
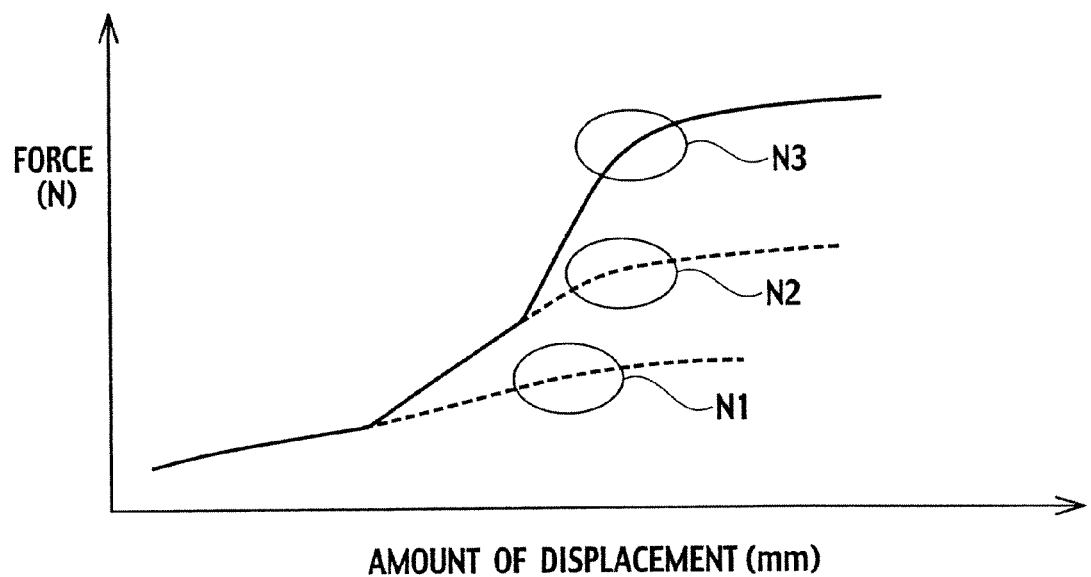
FIG. 23 is a characteristic chart showing the relationship between an amount of flexure displacement of the lock arm and a force applied to the lock arm.
Figure 24:
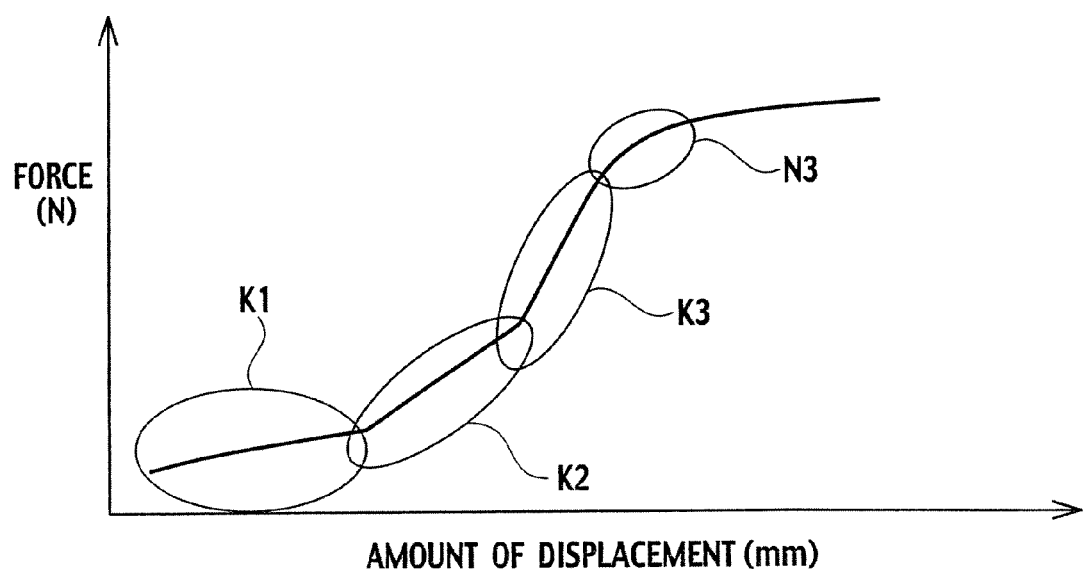
FIG. 24 is a characteristic chart showing the relationship between an amount of flexure displacement of the lock arm and a force applied to the lock arm.

The relationship between a force (a force applied to the lock arm 51) and an amount of displacement (an amount of flexure of the lock arm 51) in the process of the flexure of the lock arm 51 in this case is shown in FIGS. 23 and 24. FIG. 23 indicates that the lock arm 51 has a flexural property as a beam having a combination of multiple spring constants. FIG. 24 shows the spring property of the entire lock arm 51. In FIG. 23, N1, N2, and N3 represent an elastic bending limit of the respective portions serving as a spring. In FIG. 24, K1, K2, and K3 represent a spring constant of the respective portions serving as a spring.

In the case of the lock arm 51 having the same flexural rigidity throughout all the regions 51a to 51d aligned in a longitudinal direction, almost the whole lock arm 51 is bent both for locking and unlocking operations. Accordingly, if the flexural rigidity of the lock arm 51 is increased in order to enhance the lock retention, a force required for locking and unlocking operations will be increased. Conversely, if the flexural rigidity of the lock arm 51 is reduced so that there is no need to apply a large force for locking and unlocking operations, the lock retention will be weakened.

However, the flexural rigidity varies among the regions of the lock arm 51 which are aligned in a longitudinal direction thereof in the present embodiment of the present invention. By having such a configuration of the lock arm 51, it is possible to improve both the operability for locking and unlocking operations and the lock retention.

As described above, spring constants of the regions aligned in the longitudinal direction of the lock arm 51 are configured to be different. In the lock arm 51 having such a configuration, it is possible to sequentially shift a main flexural portion when an amount of the flexural bending approaches the spring elastic bending limits N1, N2, and N3 in the respective regions (see FIG. 23). Therefore, the displacement of the lock arm 51 can take place smoothly, and, at the same time, an amount of displacement can be larger. Hence, the operability for assembling the electronic unit 20 to the lock arm 51 and the lock retention can be improved.

In the lock arm 51 according to the present embodiment of the present invention, the flexural rigidity of the base end region 51a and the upper end regions 51c and 51d is configured to be larger than that of the middle region 51b by providing the ribs 52, 53, and 56. Therefore, it is possible to properly adjust the flexural rigidity by changing the number and/or the thickness of ribs 52, 53, and 56.

The lock projection 55 is provided with the convex curved surface portion 55a; thus, the electronic unit 20 can be smoothly inserted into the part compartment 11 of the box body 10. To be more specific, in the case where the lock arm 51 is bent due to the interference with the electronic unit 20, the lock projection 55 eventually comes to receive the interference from the electronic unit 20. By providing the lock projection 55 with the convex curved surface portion 55a, it is possible to cause a movement during such an interference to be performed smoothly. Furthermore, it is possible to smoothly convert a movement of the electronic unit 20 in association with the lock projection 55 into a movement for bending the lock arm 51; thus, the electronic unit 20 can be inserted more easily.

By inserting the electronic unit 20 obliquely into the part compartment 11, and rotating the upper portion of the electronic unit 20 with use of the inserted lower portion thereof as a supporting point, the electronic unit 20 can be easily locked to the box body 10. Furthermore, the main portions of the lock projection 55 (wall portions 55b and 55c engaging with a part being housed) are configured to be hidden in the inner side of the upper end regions 51c and 51d. In such a configuration, the main portions of the lock projection 55 (wall portions 55b and 55c engaging with a part being housed) can be protected even if the lock arm 51 is hit by a fallen object, a tool, and the like; thus, it is possible to avoid incurring any damage on the main portions which would otherwise result in a failure of locking.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A lock mechanism, comprising:
   a box body including a part compartment for housing a part;
   a lock arm provided on an inner wall of the part compartment in a cantilever manner so as to protrude from the inner wall, the lock arm being bent due to an interference between the lock arm and the part when the part is put into the part compartment; and
   a lock projection provided to a surface of the lock arm facing the part housed in the part compartment, the lock projection being engaged with the part due to a returning action of the lock arm to an original state after the part has passed through the lock projection interfering with the lock projection, wherein
   the lock arm comprises, in a longitudinal direction of the lock arm:
      a base end region located in a base end of the lock arm fixed to the inner wall of the part compartment;
      an upper end region located in a free end which interferes with the part and receives a pressing force applied for unlocking operation; and
      a middle region located within a predetermined distance range between the base end region and the upper end region,
   wherein the base end region and the upper end region each includes at least one rib that provides the base end region and the upper end region a flexural rigidity larger than a flexural rigidity of the middle region,
   wherein each of the at least one rib included in the base end region and the at least one rib included in the upper end region extends in a longitudinal direction of the lock arm and has a projection height decreasing as each of the ribs approaches the middle region, and
   wherein the thickness of the cross-section of the middle region of the lock arm is substantially narrower than the thickness of the cross-section of the base end region and the upper end region,
   wherein the locking arm projects from a perimeter of the box body, and
   wherein the projection height of the at least one rib included in the base end region decreases as the at least one rib included in the base end region projects from the perimeter of the box body towards the middle region.

2. The lock mechanism according to claim 1, wherein the lock arm has plate-shaped surfaces at the base end region and the upper end region, and
   wherein the at least one rib of the base end region and the at least one rib of the upper end region of the lock arm are integrally provided on the plate-shaped surfaces of the base end region and the upper end region.

3. The lock mechanism according to claim 1, wherein the lock projection
   is formed on a surface of the upper end region facing the part housed in the part compartment,
   includes a wall portion for engaging with the part, and
   includes a convex curved surface portion for promoting a relative sliding movement between the part and the lock projection being interfered with each other.

4. The lock mechanism according to claim 1, wherein
   a supporting member for rotatably supporting the part with one end wall of the part as a supporting point is provided on one side of the inner wall of the part compartment, and
   the lock arm is provided on another one side of the inner wall of the part compartment.

5. The lock mechanism according to claim 1, wherein the rib of the upper end region is located on a portion of the lock arm opposite the lock projection.

6. The lock mechanism according to claim 1, further comprising:
   a wall structure protruding from the inner wall and disposed adjacent to the lock arm.

7. The lock mechanism according to claim 1, wherein the at least one rib of the base region and the at least one rib of the upper region protrude from a first surface of the lock arm, and the lock projection protrudes from a second surface opposite to the first surface of the lock arm.

8. The lock mechanism according to claim 1, wherein the lock arm further comprises a groove formed in a middle portion of the second surface of the lock arm.

9. A lock mechanism comprising:
   a box body including a part compartment for housing a part; and
   a lock arm provided on an inner wall of the part compartment in a cantilever manner so as to protrude from the inner wall, wherein the lock arm includes:
   in a longitudinal direction of the lock arm:
      a base end region located in a base end of the lock arm fixed to the inner wall of the part compartment;
      an upper end region located in a free end;
      a middle region located between the base end region and the upper end region;
   a lock projection provided at the upper end region of the lock arm, the lock projection being engaged with the part,
   wherein the base end region and the upper end region each includes at least one rib that provides the base end region and the upper end region a flexural rigidity larger than a flexural rigidity of the middle region,
   wherein each of the at least one rib included in the base end region and the at least one rib included in the upper end region extends in a longitudinal direction of the lock arm and has a projection height decreasing as each of the ribs approaches the middle region, and
   wherein the thickness of the cross-section of the middle region of the lock arm is substantially narrower than the thickness of the cross-section of the base end region and the upper end region,
   wherein the locking arm projects from a perimeter of the box body, and
   wherein the projection height of the at least one rib included in the base end region decreases as the at least one rib included in the base end region projects from the perimeter of the box body towards the middle region.

10. The lock mechanism according to claim 9, wherein the lock projection is formed on a surface of the upper end region facing the part housed in the part compartment;
    includes a wall portion for engaging with the part; and
    includes a convex curved surface portion for promoting a relative sliding movement between the part and the lock projection being interfered with each other.

11. The lock mechanism according to claim 9, further comprising:
    a wall structure protruding from the inner wall and disposed adjacent to the lock arm.

12. The lock mechanism according to claim 9, wherein the at least one rib of the base region and the at least one rib of the upper region protrude from a first surface of the lock arm, and the lock projection protrudes from a second surface opposite to the first surface of the lock arm.

13. The lock mechanism according to claim 9, wherein the lock arm further comprises a groove formed in a middle portion of the second surface of the lock arm.

14. The lock mechanism according to claim 1, wherein the projection height of the at least one rib included in the upper end region increases as the at least one rib included in the upper end region projects from the perimeter of the box body away from the middle region.

15. The lock mechanism according to claim 1, wherein the at least one rib included in the upper end region has a first projection height at the upper end region which decreases as the rib approaches the middle region, and the at least one rib included in the base end region has a second projection height at the base end region which decreases as the rib approaches the middle region, and
    wherein the first projection height at the upper end region is taller than the second projection height at the base end region.

16. The lock mechanism according to claim 1, wherein the upper region, the middle region, and the base end region, each have a different elastic bending limit and a different spring constant such that the lock arm is configured to sequentially shift an amount of flexural bending of the lock arm as the amount of flexural bending approaches the elastic bending limits of the respective regions.

* * * * *